(12) United States Patent
Yeh et al.

(10) Patent No.: US 11,388,823 B2
(45) Date of Patent: Jul. 12, 2022

(54) INSULATED METAL SUBSTRATE

(71) Applicant: Jentech Precision Industrial Co., LTD., Taoyuan (TW)

(72) Inventors: Chun-Ta Yeh, Taoyuan (TW); Kuo-Pin Cheng, Taoyuan (TW); Chin-Long Lin, Taoyuan (TW)

(73) Assignee: Jentech Precision Industrial Co., Ltd., Taoyuan (TW)

( * ) Notice: Subject to any disclaimer, the term of this patent is extended or adjusted under 35 U.S.C. 154(b) by 0 days.

(21) Appl. No.: 17/076,784

(22) Filed: Oct. 21, 2020

(65) Prior Publication Data

US 2021/0045239 A1    Feb. 11, 2021

Related U.S. Application Data

(62) Division of application No. 16/711,450, filed on Dec. 12, 2019, now Pat. No. 11,083,087.

(30) Foreign Application Priority Data

Jan. 10, 2019  (TW) .................................. 108101055

(51) Int. Cl.
*H05K 1/02* (2006.01)
*H05K 3/44* (2006.01)
(Continued)

(52) U.S. Cl.
CPC ........... *H05K 3/44* (2013.01); *H01L 21/4882* (2013.01); *H01L 23/3672* (2013.01);
(Continued)

(58) Field of Classification Search
CPC ........ H05K 1/05; H05K 1/0209; H05K 3/202; H05K 3/10; H05K 1/0204; H05K 2203/13;
(Continued)

(56) References Cited

U.S. PATENT DOCUMENTS 3,982,320 A * 9/1976 Buchoff ................. G04G 17/06
                                                            968/881
4,209,481 A    6/1980 Kashiro et al.
(Continued)

FOREIGN PATENT DOCUMENTS

CN    202262036 U    5/2012
CN    102209432 B    1/2013
(Continued)

OTHER PUBLICATIONS

Tony Rogers, Everything you need to know about injection molding, Dec. 21, 2015 (Year: 2015).

*Primary Examiner* — Steven T Sawyer
(74) *Attorney, Agent, or Firm* — CKC & Partners Co., LLC

(57) ABSTRACT

An insulated metal substrate (IMS) includes a metal substrate, an insulating layer, a plastic frame, and a plurality of conductive metal pads. The insulating layer is located on the metal substrate. The plastic frame is located on the insulating layer and has a plurality of aperture areas. The conductive metal pads are located on the insulating layer and are respectively located in the aperture areas, and the conductive metal pads have sidewalls are in contact with the plastic frame.

4 Claims, 6 Drawing Sheets

(51) Int. Cl.
  *H05K 3/10* (2006.01)
  *H05K 3/20* (2006.01)
  *H01L 21/48* (2006.01)
  *H01L 23/367* (2006.01)
  *H05K 1/05* (2006.01)
  *H05K 3/46* (2006.01)

(52) U.S. Cl.
  CPC .............. *H05K 1/056* (2013.01); *H05K 3/10* (2013.01); *H05K 3/202* (2013.01); *H05K 3/4608* (2013.01); *H05K 1/0204* (2013.01); *H05K 1/0209* (2013.01); *H05K 1/05* (2013.01); *H05K 2203/13* (2013.01)

(58) Field of Classification Search
  CPC . H05K 3/44; H05K 1/056; H05K 3/20; H01L 23/3672; H01L 21/4882; H01L 23/5385; H01L 21/4857
  See application file for complete search history.

(56) References Cited

U.S. PATENT DOCUMENTS

| | | | |
|---|---|---|---|
| 5,641,944 A | 6/1997 | Wieloch et al. | |
| 6,191,367 B1* | 2/2001 | Hayashi | H05K 3/20 174/262 |
| 6,614,110 B1* | 9/2003 | Pace | H05K 3/4007 257/E23.079 |
| 8,071,998 B2* | 12/2011 | Chen | F21V 29/505 257/98 |
| 2005/0077542 A1 | 4/2005 | Asai et al. | |
| 2005/0180111 A1 | 8/2005 | Bamesberger et al. | |
| 2007/0249161 A1* | 10/2007 | Nakaone | H01R 13/2407 438/637 |
| 2011/0253423 A1* | 10/2011 | Cheng | H05K 1/0209 174/252 |
| 2014/0004780 A1* | 1/2014 | Tashiro | B24D 18/0009 451/527 |
| 2014/0041907 A1 | 2/2014 | Kim et al. | |
| 2014/0077354 A1 | 3/2014 | Yamamoto et al. | |
| 2015/0201485 A1* | 7/2015 | Denda | H05K 1/181 361/707 |
| 2015/0230328 A1* | 8/2015 | Horikawa | H01L 33/64 174/252 |
| 2015/0319841 A1* | 11/2015 | Kobayashi | H05K 1/181 174/252 |
| 2015/0382444 A1 | 12/2015 | Lin et al. | |
| 2016/0169012 A1* | 6/2016 | DaCunha | C25D 5/022 427/443.1 |
| 2018/0049316 A1* | 2/2018 | Muronoi | H05K 3/341 |
| 2018/0183160 A1 | 6/2018 | Shiomi | |
| 2020/0196435 A1 | 6/2020 | Woo | |

FOREIGN PATENT DOCUMENTS

| | | |
|---|---|---|
| CN | 103367300 A | 10/2013 |
| CN | 103392384 A | 11/2013 |
| CN | 102415225 B | 3/2014 |
| CN | 104779225 A | 7/2015 |
| CN | 103917043 B | 2/2017 |
| CN | 107331659 A | 11/2017 |
| JP | 2008-192787 A | 8/2008 |
| JP | 2010-199505 A | 9/2010 |
| JP | 2011-216619 A | 10/2011 |
| JP | 2012-248140 A | 12/2012 |
| JP | 2013-229542 A | 11/2013 |
| TW | 201108898 A1 | 3/2011 |
| TW | 201841746 A | 12/2018 |
| TW | M577178 U | 4/2019 |

\* cited by examiner

INSULATED METAL SUBSTRATE

RELATED APPLICATIONS

This application is a Divisional Application of the U.S. application Ser. No. 16/711,450, filed Dec. 12, 2019, which claims priority to Taiwan Application Serial Number 108101055, filed Jan. 10, 2019, which is herein incorporated by reference.

BACKGROUND

Field of Invention

The present disclosure relates to an insulated metal substrate.

Description of Related Art

Insulated gate bipolar transistor (IGBT) power modules for electric vehicles or hybrid vehicles require the use of insulating substrates. Therefore, a direct bond copper (DBC) substrate is generally used. However, the difference in thermal expansion coefficient between ceramic and copper is large, resulting in an easy peeling of the soldering layer between the copper layer and the heat dissipation substrate under high and low temperature tests.

Although ceramic in the direct bond copper substrate can be replaced by an insulating film, power of electronic components in the power module for the electric vehicles or the hybrid vehicles is high, and hence it is necessary to increase a thickness of the copper layer in the insulated metal substrate to enhance uniformity of heat dissipation. However, when the thickness of the copper layer is too large, circuit patterns are difficult to be formed by etching; when the circuit patterns are formed by stamping, the copper layer is pressed into several blocks under a condition in which the circuit patterns are not continuous. As such, subsequent process of combining the copper layer with the insulating film by pressing becomes difficult and complicated, and several blocks of the copper layer are easily to be misaligned when being disposed on different positions of the insulating film.

SUMMARY

An aspect of the present disclosure is to provide an insulated metal substrate.

According to an embodiment of the present disclosure, the insulated metal substrate (IMS) includes a metal substrate, an insulating layer, a plastic frame, and a plurality of conductive metal pads. The insulating layer is located on the metal substrate. The plastic frame is located on the insulating layer and has a plurality of aperture areas. The conductive metal pads are located on the insulating layer and are respectively located in the aperture areas, and the conductive metal pads have sidewalls are in contact with the plastic frame.

In an embodiment of the present disclosure, the metal substrate includes a plurality of heat dissipating structures on a surface of the metal substrate facing away from the insulating layer.

In an embodiment of the present disclosure, a thickness of the conductive metal pads is in a range from 1 mm to 5 mm.

In an embodiment of the present disclosure, a thickness of the conductive metal pads is substantially identical to a thickness of the plastic frame.

In an embodiment of the present disclosure, the conductive metal pads are surrounded and restrained by the plastic frame.

Another aspect of the present disclosure is to provide a method of manufacturing an insulated metal substrate.

According to an embodiment of the present disclosure, the method of manufacturing the insulated metal substrate includes: forming a plastic frame, wherein the plastic frame has a plurality of aperture areas; stamping a metal material to form a plurality of conductive metal pads; pressing the conductive metal pads respectively into the aperture areas of the plastic frame, such that sidewalls of the conductive metal pads are in contact with the plastic frame; and disposing the plastic frame and the conductive metal pads on an insulating layer of a metal substrate.

In an embodiment of the present disclosure, forming the plastic frame is performed by injection molding.

Another aspect of the present disclosure is to provide a method of manufacturing an insulated metal substrate.

According to an embodiment of the present disclosure, the method of manufacturing the insulated metal substrate includes: forming a plurality of conductive metal pads; forming a plastic frame surrounding the conductive metal pads, such that sidewalls of the conductive metal pads are in contact with the plastic frame; and disposing the plastic frame and the conductive metal pads on an insulating layer of a metal substrate.

In an embodiment of the present disclosure, forming the plastic frame surrounding the conductive metal pads includes: placing the conductive metal pads in a mold; and providing a plastic material in the mold to form the plastic frame by injection molding.

Another aspect of the present disclosure is to provide a method of manufacturing an insulated metal substrate.

According to an embodiment of the present disclosure, the method of manufacturing the insulated metal substrate includes: forming a plurality of conductive metal pads; laminating or coating an insulating layer on a metal substrate; disposing the conductive metal pads on the insulating layer of the metal substrate; and forming a plastic frame surrounding the conductive metal pads, such that sidewalls of the conductive metal pads are in contact with the plastic frame.

In the aforementioned embodiments of the present disclosure, in the process of manufacturing the insulated metal substrate, the metal material is first stamped to form the conductive metal pads. The conductive metal pads are then positioned in the aperture areas of the plastic frame, such that the plastic frame tightly surrounds the conductive metal pads to form a sheet-like structure. As a result, the conductive metal pads and the plastic frame can be tightly combined with the insulating layer, thereby improving the reliability of the lamination the sheet-like structure onto the insulating layer. In addition, since the plastic frame has an insulating characteristic and a temperature-resisting characteristic, and has substantially identical physical properties (e.g., thermal expansion coefficient) to the metal (e.g., copper) substrate and the insulating layer, the plastic frame can be preserved in the insulated metal substrate after the lamination is completed without affecting subsequent manufacturing processes. Furthermore, by laminating the sheet-like structure including the plastic frame and the conductive metal pads onto the metal substrate through the insulating layer, soldering layers used in a conventional process of manufacturing the direct bond copper substrate can be saved, such that the cost can be reduced. In addition, since the conductive metal pads are disposed on the insulating layer after being restrained by the plastic frame, the conductive metal pads are less likely to be misaligned.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
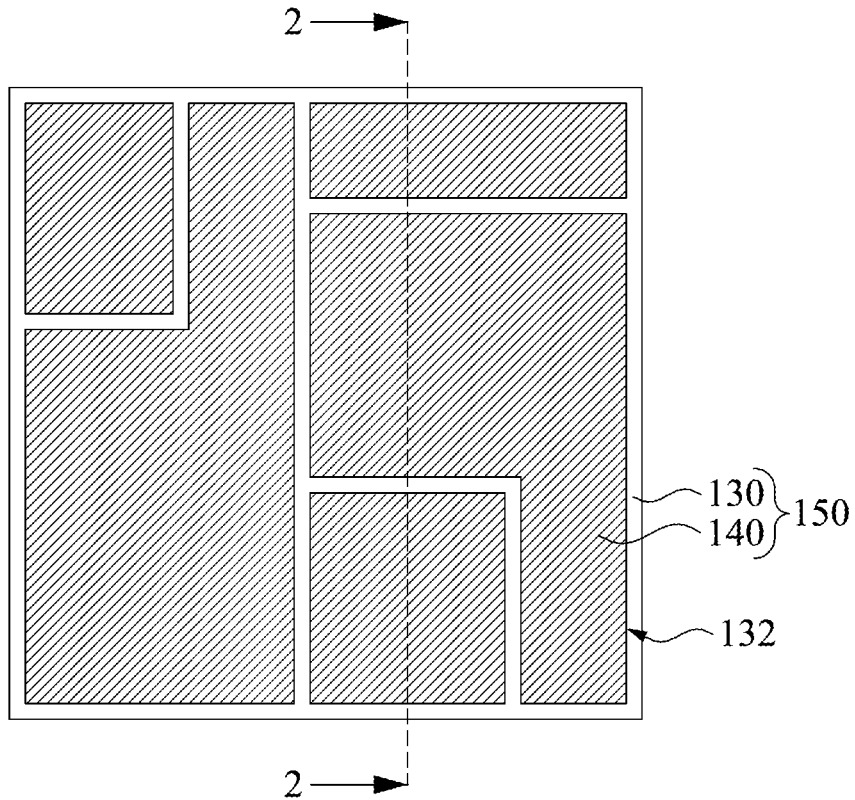
FIG. 1 is a top view of an insulated metal substrate according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
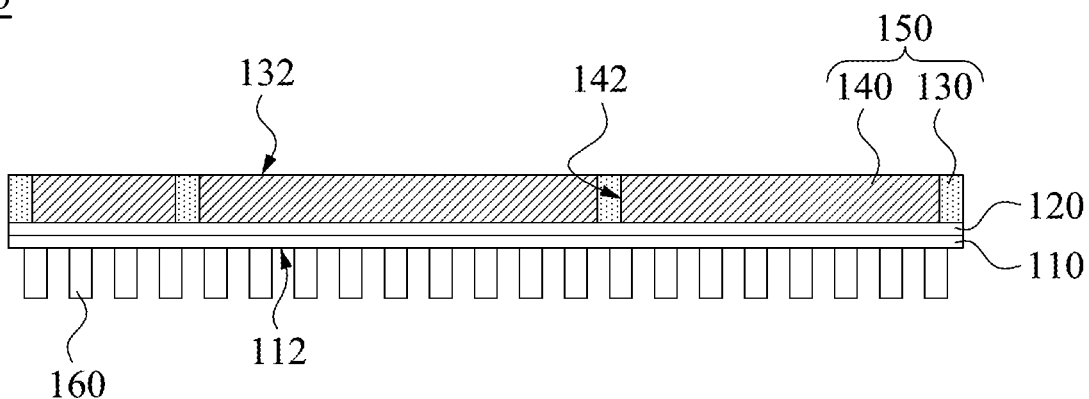
FIG. 2 is a cross-sectional view of the insulated metal substrate taken along line 2-2 shown in FIG. 1.

FIG. 1 is a top view of an insulated metal substrate 100 according to an embodiment of the present disclosure. FIG. 2 is a cross-sectional view of the insulated metal substrate 100 taken along line 2-2 shown in FIG. 1. Reference is made to FIG. 1 and FIG. 2, the insulated metal substrate 100 includes a metal substrate 110, an insulating layer 120, a plastic frame 130, and a plurality of conductive metal pads 140. The insulating layer 120 is located on the metal substrate 110. The plastic frame 130 is located on the insulating layer 120 and has a plurality of aperture areas 132. The conductive metal pads 140 are located on the insulating layer 120 and are respectively located in the aperture areas 132, and the conductive metal pads 140 have sidewalls 142 being in contact with the plastic frame 130.

In the present embodiment, a plurality of heat dissipating structures 160 are on a surface 112 of the metal substrate 110 facing away from the insulating layer 120. In other embodiments, the metal substrate 110 is a planar substrate without heat dissipating structures 160, but the present disclosure is not limited in this regard.

In addition, since the insulated metal substrate 100 in the present embodiment can be applied to an insulated gate bipolar transistor (IGBT) power module in an electric vehicle or a hybrid vehicle, and electronic components in such a power module are high in power, it is necessary to increase a thickness of the conductive metal pads 140 to enhance uniformity of heat dissipation. The thickness of the conductive metal pads 140 in the present embodiment may be in the range from 1 mm to 5 mm (e.g., a thickness of 3 mm), which can effectively enhance the uniformity of the heat dissipation. In the present embodiment, the conductive metal pads 140 may be made of a material including copper, but the present disclosure is not limited in this regard.

Since the conductive metal pads 140 are surrounded by the plastic frame 130 and positioned in the aperture areas 132 of the plastic frame 130, and the thickness of the conductive metal pads 140 is substantially identical to a thickness of the plastic frame 130, a sheet-like structure 150 with substantially flat top and bottom surfaces can be formed. Since the sheet-like structure 150 including the conductive metal pads 140 and the plastic frame 130 has a substantially tight and flat bottom surface, the step of laminating the sheet-like structure 150 onto the insulating layer 120 can be simplified, and hence tightness and reliability of the lamination can be improved. Furthermore, since the conductive metal pads 140 are disposed on the insulating layer 120 after being restrained by the plastic frame 130, the conductive metal pads 140 are less likely to be misaligned. In the present embodiments, the plastic frame 130 may be made of a material including epoxy resin, but the present disclosure is not limited in this regard. Since the plastic frame 130 has an insulating characteristic and a temperature-resisting characteristic, and has substantially identical physical properties (e.g., thermal expansion coefficient) to the metal substrate 110 (e.g., copper substrate 110) and the insulating layer 120, the lamination can be simplified, the plastic frame 130 can be preserved in the insulated metal substrate 100 without affecting subsequent manufacturing processes, and the insulated metal substrate 100 can further pass through tests under high and low temperatures.

In addition, by laminating the sheet-like structure 150 formed by the plastic frame 130 and the conductive metal pads 140 onto the insulating layer 120 on the metal substrate 110, the tightness and the reliability of the lamination can be improved, and a soldering layer in a conventional direct bond copper (DBC) substrate can be saved to reduce the cost. In the present embodiment, the insulating layer 120 may be made of a material including epoxy resin, but the present disclosure is not limited in this regard.

It is to be noted that the connection relationships, the materials, and the advantages of the elements described above will not be repeated. In the following description, a manufacturing method of the insulated metal substrate 100 will be described.

Figure 3:
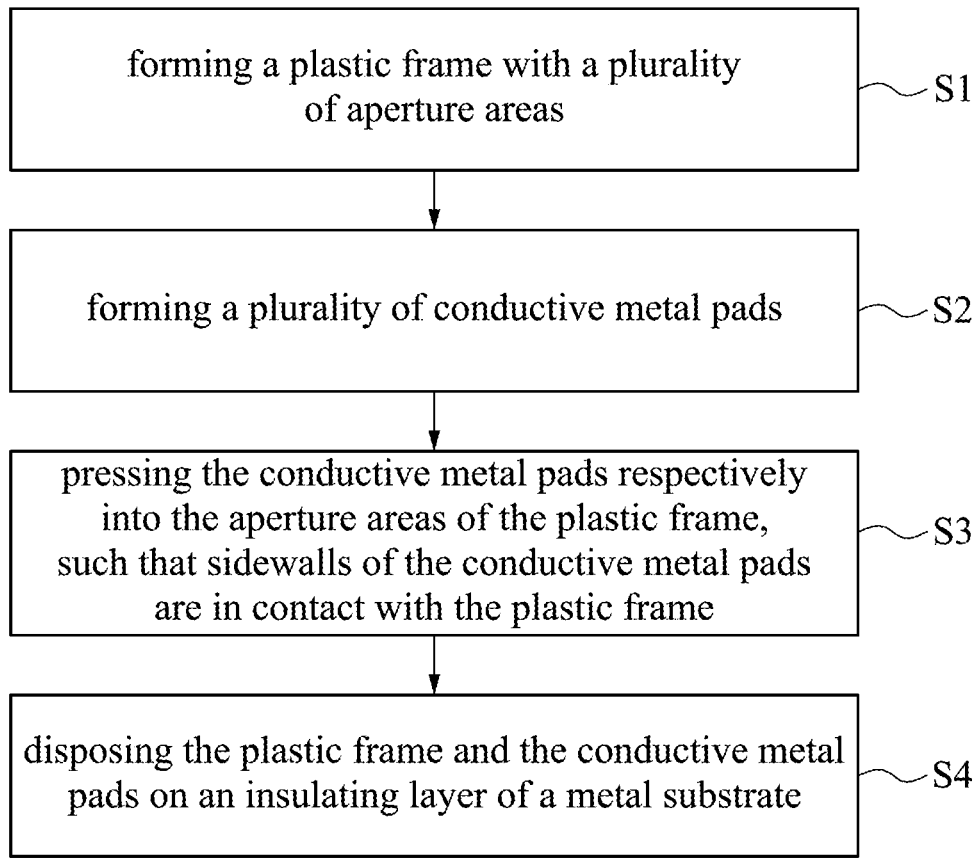
FIG. 3 is a flow chart of a method of manufacturing an insulated metal substrate according to an embodiment of the present disclosure.
Figure 4:
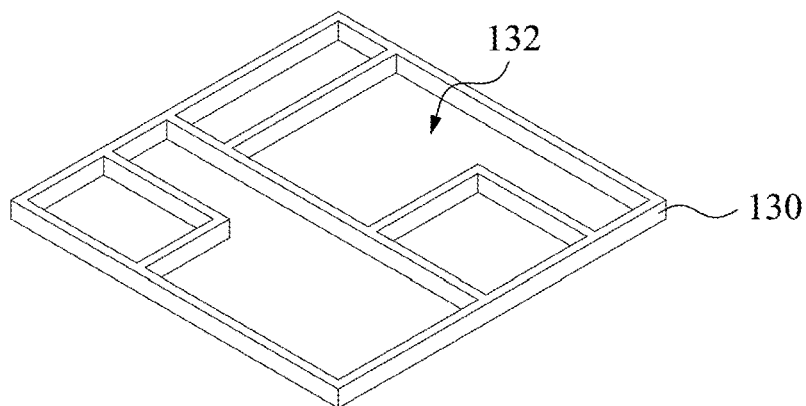
FIG. 4 is a schematic view of assembling the insulated metal substrate by the method of manufacturing the insulated metal substrate shown in FIG. 3.
Figure 4:
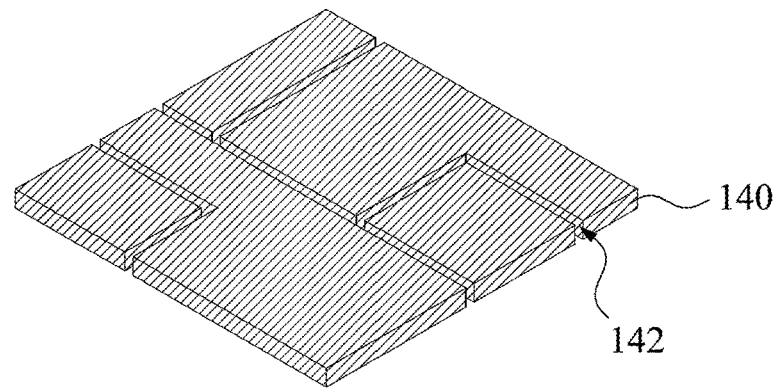
Figure 4:
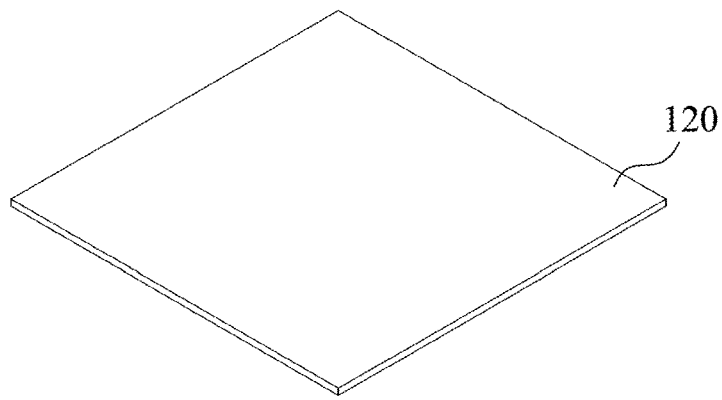
Figure 4:
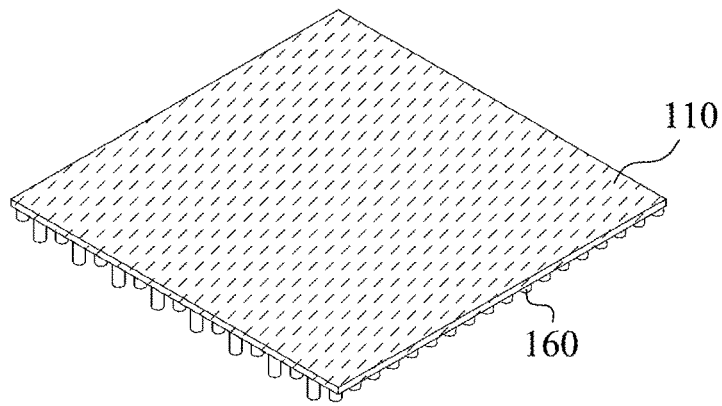

FIG. 3 is a flow chart of a method of manufacturing the insulated metal substrate 100 according to an embodiment of the present disclosure. FIG. 4 is a schematic view of assembling the insulated metal substrate 100 by the method of manufacturing the insulated metal substrate 100 shown in FIG. 3. Reference is made to FIG. 3 and FIG. 4. The method of manufacturing the insulated metal substrate 100 includes the following steps. In step S1, a plastic frame 130 having a plurality of aperture areas 132 is formed. In step S2, a plurality of conductive metal pads 140 are formed. In step S3, the conductive metal pads 140 are respectively pressed into the aperture areas 132 of the plastic frame 130, such that sidewalls 142 of the conductive metal pads 140 are in contact with the plastic frame 130. In step S4, the plastic frame 130 and the conductive metal pads 140 are disposed on an insulating layer 120 on a metal substrate 110. In the following descriptions, the aforementioned steps will further be described.

First, the plastic frame 130 having the aperture areas 132 is formed by providing a plastic material in a mold and performing injection molding. In the present embodiment, the plastic frame 130 may be made of a material including epoxy resin, but the present disclosure is not limited in this regard. Next, the conductive metal pads 140 are formed as conductive patterns by stamping a metal material. In the present embodiment, the metal material may be a thick copper plate, such that a thickness of the conductive metal pads 140 is large enough to apply to the power module for the electric vehicles or the hybrid vehicles and enhance the uniformity of the heat dissipation.

After the plastic frame 130 having the aperture areas 132 and the conductive metal pads 140 are formed, the conductive metal pads 140 are respectively positioned in the aperture areas 132 of the plastic frame 130 by pressing, such that the sidewalls 142 of the conductive metal pads 140 are in contact with the plastic frame 130, and the plastic frame 130 surrounds the conductive metal pads 140 and is tightly combined with the conductive metal pads 140. In other words, the plastic frame 130 and the conductive metal pads 140 are tightly attached. Since a thickness of the plastic frame 130 is substantially identical to the thickness of the conductive metal pads 140, the sheet-like structure 150 formed by pressing the conductive metal pads 140 into the plastic frame 130 has substantially tight and flat top and bottom surfaces, such that the lamination of the sheet-like structure 150 to the insulating layer 120 on the metal substrate 110 can be facilitated. In the present embodiment, the insulating layer 120 may be formed by laminating an insulating film onto the metal substrate 110 or by coating an insulating paste onto the metal substrate 110. In addition, in the present embodiment, the material of the plastic frame 130 (e.g., epoxy resin) may have an insulating characteristic and a temperature-resisting characteristic, and may have a similar thermal expansion coefficients to the conductive metal pads 140 and the plastic frame 130.

Next, the sheet-like structure 150 formed by the plastic frame 130 and the conductive metal pads 140 is laminated onto the insulating layer 120 on the metal substrate 110. As such, the soldering layer in the conventional direct bond copper (DBC) substrate can be saved to reduce the cost. In the present embodiment, the metal substrate 110 may be a planar substrate or a heat dissipating substrate having heat dissipating structures 160, but the present disclosure is not limited in this regard.

Since the plastic frame 130 and the conductive metal pads 140 are separately formed by injection molding and stamping, and the plastic frame 130 and the conductive metal pads 140 are pressed together to form the sheet-like structure 150 with a substantially tight and flat bottom surface, the lamination of the sheet-like structure 150 onto the insulating layer 120 on the metal substrate 110 is simplified, such that the tightness and reliability of the lamination are improved. In addition, the conductive metal pads 140 are restrained by the plastic frame 130 after being disposed on the insulating layer 120, such that the conductive metal pads 140 are less likely to be misaligned. Furthermore, since the material of the plastic frame 130 (e.g., epoxy resin) may have an insulating characteristic and a temperature-resisting characteristic, and may have a similar thermal expansion coefficients to the conductive metal pads 140 and the plastic frame 130, the plastic frame 130 can be preserved in the insulated metal substrate 100 without affecting the subsequent manufacturing processes.

Figure 5:
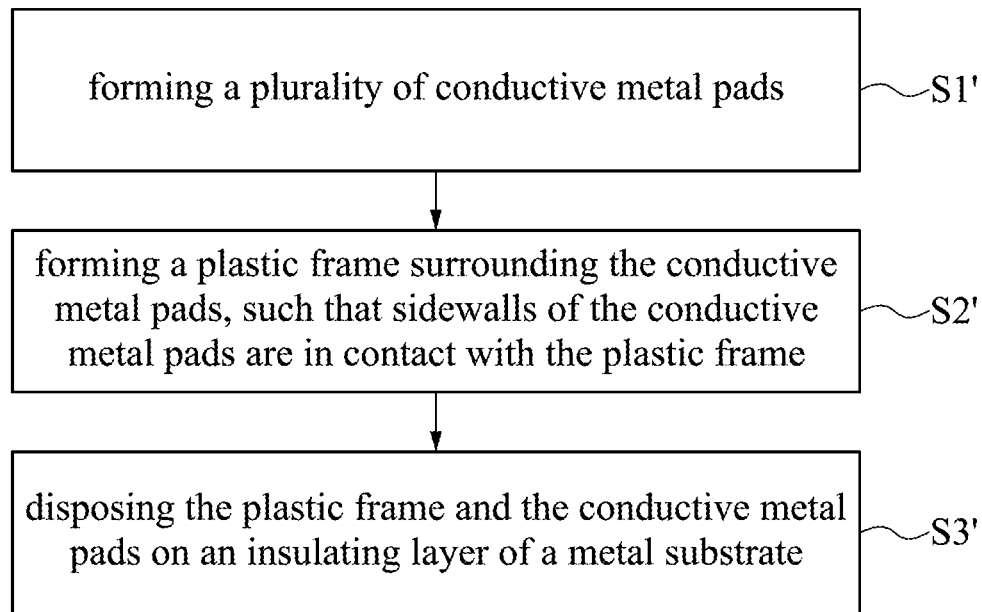
FIG. 5 is a flow chart of a method of manufacturing an insulated metal substrate according to another embodiment of the present disclosure.
Figure 6:
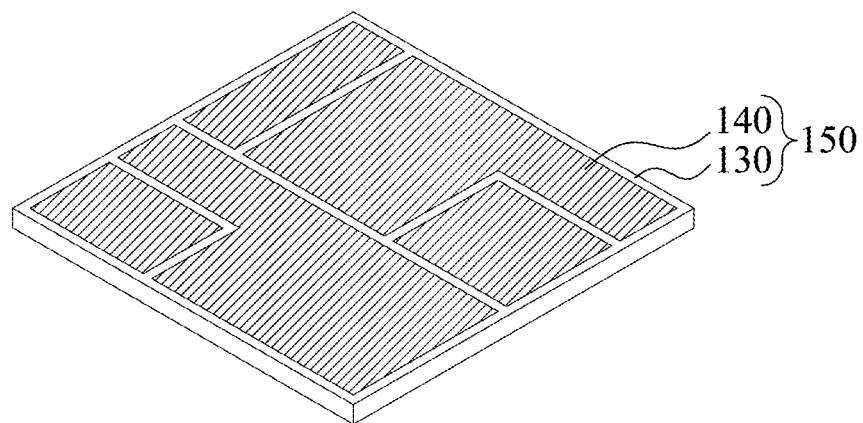
FIG. 6 is a schematic view of assembling the insulated metal substrate by the method of manufacturing the insulated metal substrate shown in FIG. 5.
Figure 6:
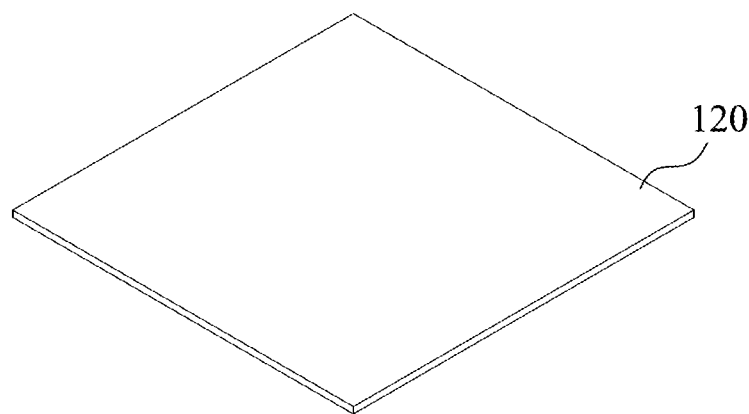
Figure 6:
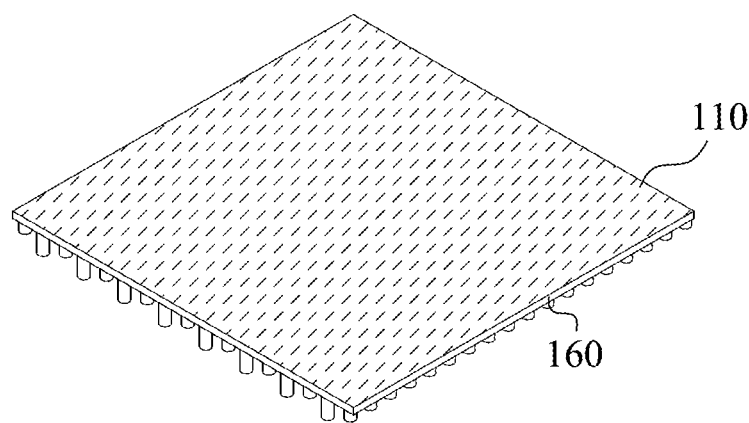

FIG. 5 is a flow chart of a method of manufacturing the insulated metal substrate 100 according to another embodiment of the present disclosure. FIG. 6 is a schematic view of assembling the insulated metal substrate 100 by the method of manufacturing the insulated metal substrate shown in FIG. 5. The method of manufacturing the insulated metal substrate 100 includes the following steps. In step S1', a plurality of conductive metal pads 140 are formed. In step S2', a plastic frame 130 is formed to surround the conductive metal pads 140, such that sidewalls 142 of the conductive metal pads 140 are in contact with the plastic frame 130. In step S3', the plastic frame 130 and the conductive metal pads 140 are disposed on an insulating layer 120 on a metal substrate 150.

First, the conductive metal pads 140 are formed as conductive patterns by stamping a metal material. In the present embodiment, the metal material may be a copper plate, such that a thickness of the conductive metal pads 140 can be in a range from 1 mm to 5 mm (e.g., a thickness of 3 mm), but the present disclosure is not limited in this regard.

Next, the conductive metal pads 140 are placed in a mold, and a plastic material is provided in the mold to form the plastic frame 130 tightly surrounding the conductive metal pads 140, such that a sheet-like structure 150 including the plastic frame 130 and the conductive metal pads 140 is formed. In other words, the plastic frame 130 and the conductive metal pads 140 are tightly attached. In the present embodiment, the plastic frame 130 may be made of a material including epoxy resin, but the present disclosure is not limited in this regard. Through the design of the mold, a height of the plastic frame 130 (which is formed by providing the plastic material in the mold and performing injection molding) surrounding the conductive metal pads 140 is substantially identical to a height of the conductive metal pads 140, that is, the sheet-like structure 150 has substantially tight and flat top and bottom surfaces to facilitate the lamination of the sheet-like structure 150 onto the insulating layer 120 on the metal substrate 110. In the present embodiment, the insulating layer 120 may be formed by laminating an insulating film onto the metal substrate 110 or by coating an insulating paste onto the metal substrate 110. It is noted that a difference between the present embodiment and the previous embodiment lies in the method of forming the plastic frame 130. In the present embodiment, the plastic frame 130 is formed by placing the conductive metal pads 140 in the mold and forming the plastic frame 130 by injection molding, such that the conductive metal pads 140 are surrounded by the plastic frame 130 to form the sheet-like structure 150. This method allows the combination of the conductive metal pads 140 and the plastic frame 130 to be tighter to enhance the structural stability.

Next, the sheet-like structure 150 formed by the plastic frame 130 and the conductive metal pads 140 is laminated onto the insulating layer 120 on the metal substrate 110. As such, the soldering layer in the conventional direct bond copper (DBC) substrate can be saved to reduce the cost. In the present embodiment, the metal substrate 110 may be a planar substrate or a heat dissipating substrate having heat dissipating structures 160, but the present disclosure is not limited in this regard.

Figure 7:
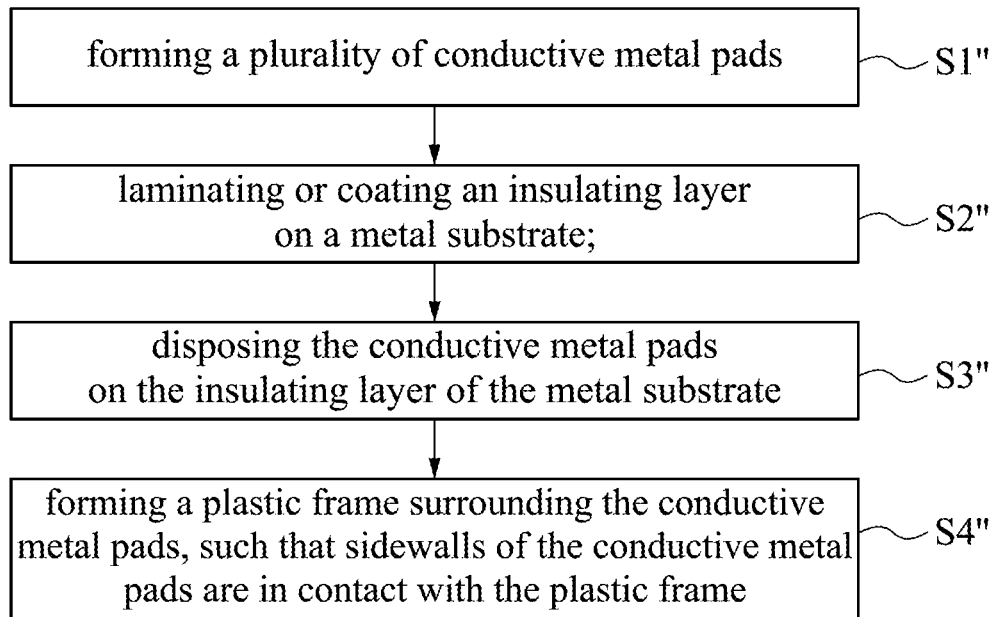
FIG. 7 is a flow chart of a method of manufacturing an insulated metal substrate according to another embodiment of the present disclosure.

FIG. 7 is a flow chart of a method of manufacturing the insulated metal substrate 100 according to another embodiment of the present disclosure. The method of manufacturing the insulated metal substrate 100 includes the following steps. In step S1", a plurality of conductive metal pads are formed. In step S2", an insulating layer is laminated onto a metal substrate, or an insulating paste is coated onto a metal substrate to be waited for becoming a semi-colloid state. In step S3", the conductive metal pads are disposed on the insulating layer on the metal substrate. In step S4", the conductive metal pads and the metal substrate having the insulating layer are together placed in a mold, and the plastic frame is formed by injection molding, such that the plastic frame surrounding the conductive metal pads is formed, and the sidewalls of the conductive metal pads are in contact with the plastic frame.

Since the conductive metal pads 140 are placed in a mold after being formed by stamping a metal material, and a plastic material is placed in the mold to form the plastic frame 130 by injection molding, the sheet-like structure 150 including the plastic frame 130 and the conductive metal pads 140 is formed. This method allows the combination of the conductive metal pads 140 and the plastic frame 130 to be tighter to enhance the structural stability. Through the design of the mold, the sheet-like structure 150 including the conductive metal pads 140 and the plastic frame 130 has a substantially tight and flat bottom surface, such that the lamination of the sheet-like structure 150 onto the insulating layer 120 on the metal substrate 110 is simplified, and the tightness and the reliability of the lamination are improved. In addition, the conductive metal pads 140 are disposed on the insulating layer 120 after being restrained by the plastic frame 130, such that the conductive metal pads 140 are less likely to be misaligned. Furthermore, since the material of the plastic frame 130 (e.g., epoxy resin) may have an insulating characteristic and a temperature-resisting characteristic, and may have a similar thermal expansion coefficients to the conductive metal pads 140 and the plastic frame 130, the plastic frame 130 can be preserved in the insulated metal substrate 100 without affecting the subsequent manufacturing processes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. An insulated metal substrate (IMS), comprising:
 a metal substrate comprising copper;
 an insulating layer on the metal substrate;
 a plastic frame on the insulating layer and has a plurality of aperture areas, wherein the plastic frame comprises epoxy resin; and
 a plurality of conductive metal pads on the insulating layer and are respectively located in the aperture areas, wherein the conductive metal pads have sidewalls in contact with the plastic frame, and a thickness of the conductive metal pads is in a range from 1 mm to 5 mm, and a total vertical projection area of the conductive metal pads on the metal substrate is larger than a vertical projection area of the plastic frame on the metal substrate.

2. The insulated metal substrate of claim 1, wherein the metal substrate comprises a plurality of heat dissipating structures on a surface of the metal substrate facing away from the insulating layer.

3. The insulated metal substrate of claim 1, wherein a thickness of the conductive metal pads is substantially identical to a thickness of the plastic frame.

4. The insulated metal substrate of claim 1, wherein the conductive metal pads are surrounded and restrained by the plastic frame.

* * * * *